US012712046B2

(12) United States Patent
Gnanaraj

(10) Patent No.: US 12,712,046 B2
(45) Date of Patent: Aug. 18, 2026

(54) PERFORMING MULTI-PLANE TEST OPERATION ON DYNAMICALLY DETERMINED BLOCK STRIPE

(71) Applicant: Micron Technology, Inc., Boise, ID (US)

(72) Inventor: Maniraj Ashirwad Gnanaraj, Tamil Nadu (IN)

(73) Assignee: Micron Technology, Inc., Boise, ID (US)

( * ) Notice: Subject to any disclaimer, the term of this patent is extended or adjusted under 35 U.S.C. 154(b) by 59 days.

(21) Appl. No.: 18/789,300

(22) Filed: Jul. 30, 2024

(65) Prior Publication Data

US 2026/0038621 A1 Feb. 5, 2026

(51) Int. Cl.
*G11C 29/44* (2006.01)

(52) U.S. Cl.
CPC .................................... *G11C 29/44* (2013.01)

(58) Field of Classification Search
None
See application file for complete search history.

(56) References Cited

U.S. PATENT DOCUMENTS

2014/0372838 A1* 12/2014 Lou ........................ G06F 3/0689 714/801
2015/0154090 A1* 6/2015 Chatterjee ........... G06F 11/2056 714/6.24
2016/0055918 A1* 2/2016 Kochar ............. G11C 16/0483 365/185.11
2023/0075437 A1* 3/2023 Xu ...................... G06F 12/0868

FOREIGN PATENT DOCUMENTS

CN 112395127 A * 2/2021 .......... G06F 11/1032
CN 112802530 A * 5/2021 ............. G11C 29/04

* cited by examiner

*Primary Examiner* — Guerrier Merant
(74) *Attorney, Agent, or Firm* — Schwegman Lundberg & Woessner, P.A.

(57) ABSTRACT

Various embodiments provide for performing a multi-plane test operation on a dynamically determined block stripe of a memory device, which can be part of a memory system, such as a memory sub-system.

20 Claims, 5 Drawing Sheets

400

| | | PLANES | | | | | |
|---|---|---|---|---|---|---|---|
| OPERATION # | BLOCK # | P0 | P1 | P2 | P3 | P4 | P5 |
| 1 | 0 | | | 1 | 1 | | |
| 2 | 1 | 1 | 1 | | | 1 | 1 |
| 3 | 2 | 2 | 2 | 2 | 2 | 2 | 2 |
| 4 | 3 | | | 3 | 3 | 3 | 3 |
| 5 | 4 | 3 | 3 | 4 | | | 4 |
| 6 | 5 | | 4 | 5 | 4 | 4 | 5 |
| 7 | 6 | 4 | | | | 5 | |
| 8 | 7 | 5 | 5 | | | 6 | |
| 9 | 8 | | 6 | 6 | 5 | | |
| 10 | 9 | 6 | | | 6 | | 6 |

BAD BLOCK

BLOCK THAT CAN BE SKIPPED

402

404 406 408

| | | PLANES | | | | | |
|---|---|---|---|---|---|---|---|
| OPERATION # | BLOCK # | P0 | P1 | P2 | P3 | P4 | P5 |
| 1 | 0 | | | 1 | 1 | | |
| | 1 | 1 | 1 | | | 1 | 1 |
| 2 | 2 | 2 | 2 | 2 | 2 | 2 | 2 |
| 3 | 3 | | | 3 | 3 | 3 | 3 |
| | 4 | 3 | 3 | | | | |
| 4 | 4 | | | 4 | | | 4 |
| | 5 | | 4 | | 4 | 4 | |
| | 6 | 4 | | | | | |
| 5 | 5 | | | 5 | | | 5 |
| | 6 | | | | | 5 | |
| | 7 | 5 | 5 | | | | |
| | 8 | | | | 5 | | |
| 6 | 7 | | | | | 6 | |
| | 8 | | 6 | 6 | | | |
| | 9 | 6 | | | 6 | | 6 |

FIG. 4

PERFORMING MULTI-PLANE TEST OPERATION ON DYNAMICALLY DETERMINED BLOCK STRIPE

TECHNICAL FIELD

Embodiments of the disclosure relate generally to memory devices and, more specifically, to performing a multi-plane test operation on a dynamically determined block stripe of a memory device, which can be part of a memory system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 provides a table illustrating an example of performing a multi-plane test operation on a dynamically determined block stripe of a memory device, in accordance with some embodiments of the present disclosure.

DETAILED DESCRIPTION

Figure 1:
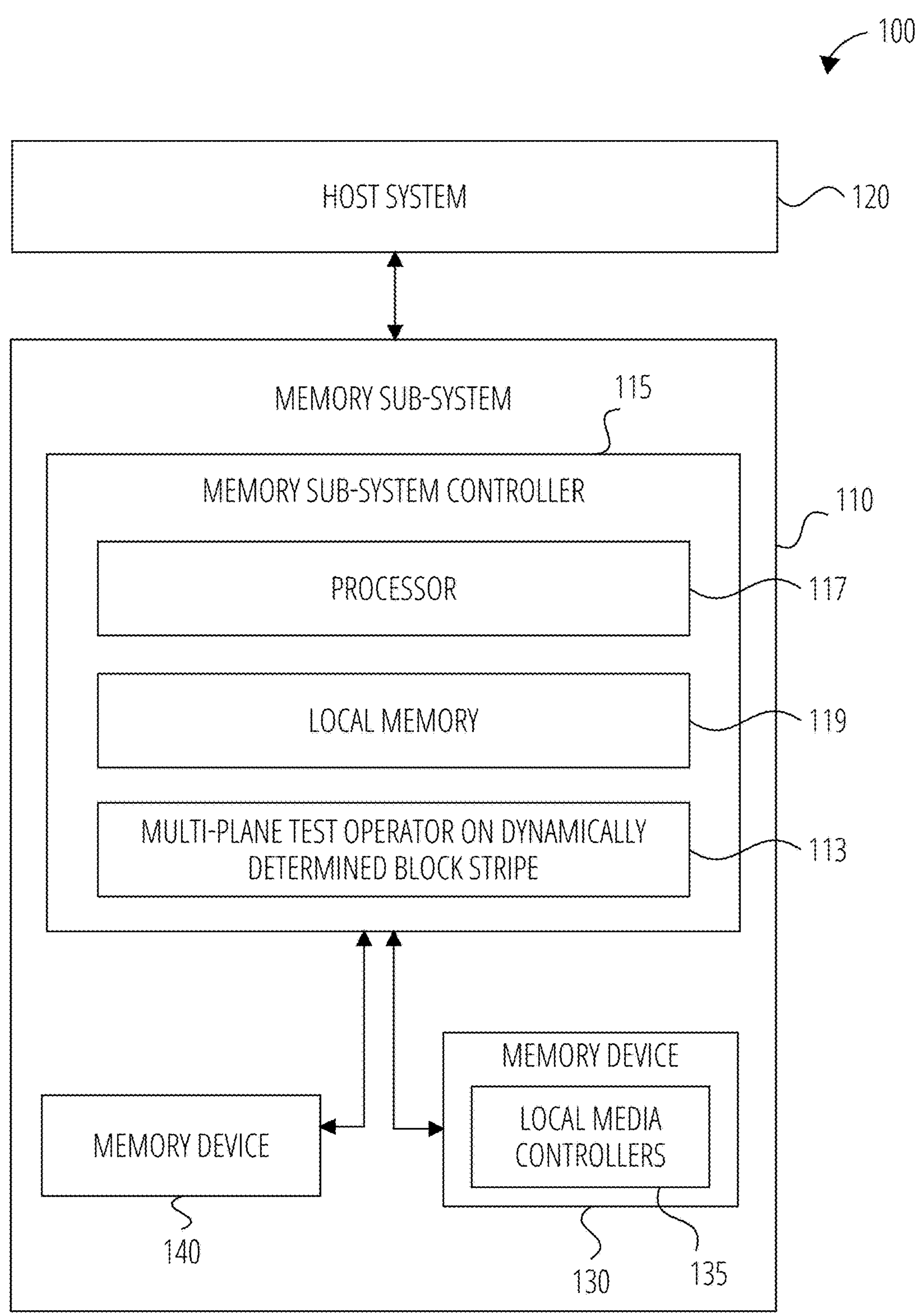
FIG. 1 is a block diagram illustrating an example computing system that includes a memory sub-system, in accordance with some embodiments of the present disclosure.

Aspects of the present disclosure are directed to performing a multi-plane test operation on a dynamically determined block stripe of a memory device, which can be part of a memory system, such as a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write command, read command) to the memory sub-system, such as to store data on a memory device at the memory sub-system, read data from the memory device on the memory sub-system, or write/read constructs (e.g., such as submission and completion queues) with respect to a memory device on the memory sub-system. The data to be read or written, as specified by a host request, is hereinafter referred to as "host data" or "user data."

A host request can include logical address information (e.g., logical block address (LBA), namespace) for the host data, which is the location the host system associates with the host data and a particular zone in which to store or access the host data. The logical address information (e.g., LBA, namespace) can be part of metadata for the host data. Metadata can also include error handling data (e.g., error-correcting code (ECC) code word, parity code), data version (e.g., used to distinguish age of data written), valid bitmap (which LBAs or logical transfer units contain valid data), and so forth.

The memory sub-system can initiate media management operations, such as a write operation, on host data that is stored on a memory device. For example, firmware of the memory sub-system may re-write previously written host data from a location of a memory device to a new location as part of garbage collection management operations. The data that is re-written, for example as initiated by the firmware, is hereinafter referred to as "garbage collection data."

"User data" hereinafter generally refers to host data and garbage collection data. "System data" hereinafter refers to data that is created and/or maintained by the memory sub-system for performing operations in response to host requests and for media management. Examples of system data include, and are not limited to, system tables (e.g., logical-to-physical memory address mapping table (also referred to herein as a L2P table), data from logging, scratch pad data, and so forth).

A memory device can be a non-volatile memory device. A non-volatile memory device is a package of one or more die. Each die can be comprised of one or more planes. For some types of non-volatile memory devices (e.g., AND-type devices), each plane is comprised of a set of physical blocks. For some memory devices, blocks are the smallest area that can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are a raw memory device combined with a local embedded controller for memory management within the same memory device package. The memory device can be divided into one or more zones where each zone is associated with a different set of host data or user data or application.

Certain memory devices, such as NAND-type memory devices, comprise one or more blocks, (e.g., multiple blocks), with each of those blocks comprising multiple memory cells. For instance, a memory device can comprise multiple pages (also referred to as wordlines), with each page comprising a subset of memory cells of the memory device. A threshold voltage (VT) of a memory cell (of a block) can be the voltage at which the floating gate (e.g., NAND transistor), implementing the memory cell, turns on and conducts (e.g., to a bit line coupled to the memory cell). Generally, writing data to such memory devices involves programming (by way of a program operation) the memory devices at the page level of a block, and erasing data from such memory devices involves erasing the memory devices at the block level (e.g., page level erasure of data is not possible).

A memory device can comprise one or more blocks. A block can comprise a single-level cell (SLC) block that comprises multiple SLCs, a multiple-layer cell (MLC) block that comprises multiple MLCs, a TLC block comprises multiple TLCs, or a quad-level cell (QLC) block that comprises multiple QLCs.

After a memory system (e.g., memory sub-system 110) has been manufactured, the memory system can be subjected to one or more manufacturing tests, which is usually facilitated by a manufacturing test firmware (MTFW) that is run by the memory system. The tests performed by the MTFW can ensure that the memory system, and the memory devices thereof, are operating free of defects. As part of those tests, the quality of a memory device (e.g., NAND-type memory device) of the memory system can be evaluated, and a quality index value of the memory device can be generated (e.g., NAND figure of merit (NFOM)), for the memory device. During the quality evaluation of the memory device, blocks of the memory device can be erased, written (e.g., programmed), and read, and certain blocks will be identified and marked as bad blocks (BB). These bad blocks can also be referred to as burn-in bad blocks (BIBB). The quality evaluation can also use smart manufacturing artificial intelligence (SMAI), which can comprise a predictive algorithm (e.g., good block prediction algorithm based on one or more machine learning (ML) models) that predicts blocks that are good (e.g., based on blocks already marked as bad, such as BIBB) and can be skipped for evaluation (e.g., testing).

To generate the quality index value (e.g., NFOM) of a memory device, a MTFW traditionally causes a multi-plane erase/write/read operation to be performed in block order (e.g., from a start block to an end block) across multiple (e.g., all) planes without considering blocks marked as bad (e.g., BIBB) and those already identified as good (e.g., SMAI good block). While use of a SMAI good block prediction algorithm can facilitate the skipping of testing of ~40-60% blocks during generation of the quality index value (e.g., NFOM), this usually only translates to a marginal test time reduction (e.g., ~8%) because predicted good blocks are distributed randomly and all planes are not used every time during a multi-plane operation. Additionally, the multi-plane operation performed is not efficient when there are bad blocks or good blocks (e.g., guaranteed good blocks identified by SMAI) in a few planes for which the multi-plane operation can be skipped. Specifically, if there are one or more bad blocks in a given plane, the given plane will be skipped during the multi-plane operation. The planes with the bad blocks are not replaced with the next good block during the erase/write/read operations, so those planes remain idle during memory (e.g., NAND) operations. As a result, the total number of memory (e.g., NAND) operations remains the same even if some blocks in a few planes are skipped during the multi-plane operation.

Various embodiments described herein provide cure or address deficiencies of conventional methodologies for performing multi-plane test operations. In particular, various embodiments optimize performance of multi-plane test operations by selecting an individual block independently for each plane (e.g., of a memory die) of a memory device based on a distribution of bad blocks (e.g., BIBB), good blocks (e.g., SMAI-identified good blocks), rather than using a same block across as many planes as possible (e.g., of the memory die) of the memory device. Some embodiments ensure that no plane remains idle unless it has no more blocks to test, thereby maximizing the efficiency of performing multi-plane test operations, such as during a test process that involves multi-plane test operations (e.g., a quality index value-generation, such as a NFOM test process). According to some embodiments, block stripes for multi-plane test operations are dynamically formed with a next sequential good block across as many planes as possible (e.g., of a memory die) of a memory device, which can deviate from a conventional method of using blocks in physical order. Various embodiments perform one or more iterations of a test process, where each test iteration comprises identifying (e.g., forming) a current block stripe (e.g., NFOM chunk) comprising a next sequential good block for each plane of the memory device, and performing one or more multi-plane test operations on the current block stripe. Some embodiments scan a bad block table (e.g., describing bad blocks of the memory device) and the SMAI block bit map (e.g., describing good blocks of the memory device identified by SMAI), and use bad blocks identified by the bad block table and good blocks identified by the SMAI block bit map to identify a current block stripe for a given iteration of the test process. For some embodiments, one or more multi-plane test operations performed on a current block stripe (during a given iteration) comprises performing a multi-plane erase operation on the current stripe block stripe (e.g., to erase any currently stored data in the current block stripe), a multi-plane write (e.g., program) operation on the current stripe block stripe (e.g., to write test data to blocks of the current block stripe), and a multi-plane read operation on the current stripe block stripe (e.g., to read back the test data from the current block stripe). This approach can not only ensure that as many planes as possible (e.g., of a memory die) of a memory device are used during the performance of multi-plane operations of a test process (e.g., NFOM test process) but also can lead to a substantial reduction in test time (e.g., in manufacturing contexts).

Disclosed herein are some examples of performing a multi-plane test operation on a dynamically determined block stripe of a memory device (e.g., of a memory system), as described herein.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IOT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory devices 130, 140 when the memory sub-system 110 is coupled with the host system 120 by the PCIe or CXL interface. The physical host interface can provide an interface for passing control, address, data, and other signals between the memory sub-system 110 and the host system 120.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional (2D) NAND and 3D NAND.

Each of the memory devices 130, 140 can include one or more arrays of memory cells. One type of memory cell, for example, SLCs, can store one bit per cell. Other types of memory cells, such as MLCs, TLCs, QLCs, and penta-level cells (PLCs), can store multiple bits per cell. In some embodiments, each of the memory devices 130, 140 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130, 140 can be grouped as pages that can refer to a logical unit of the memory device used to store data. With some types of memory (e.g., NAND), pages can be grouped to form blocks. As used herein, a block comprising SLCs can be referred to as a SLC block, a block comprising MLCs can be referred to as a MLC block, a block comprising TLCs can be referred to as a TLC block, and a block comprising QLCs can be referred to as a QLC block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative-or (NOR) flash memory, and electrically erasable programmable read-only memory (EEPROM).

A memory sub-system controller 115 (or controller 115 for simplicity) can communicate with the memory devices 130, 140 to perform operations such as reading data, writing data, or erasing data at the memory devices 130, 140 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and so forth. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and ECC operations, encryption operations, caching operations, and address translations between a logical address (e.g., LB A, namespace) and a physical memory address (e.g., physical block address) that are associated with the memory devices 130, 140. The memory sub-system controller 115 can further include host interface circuitry to communicate with the host system 120 via the physical host interface. The host interface circuitry can convert the commands received from the host system 120 into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130, 140.

In some embodiments, the memory device 130 includes local media controllers 135 that operate in conjunction with memory sub-system controller 115 to execute operations on one or more memory cells of the memory device 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device.

The memory sub-system controller 115 includes a multi-plane test operator on dynamically determined block stripe 113 (hereafter, the multi-plane test operator 113) that enables or facilitates the memory sub-system controller 115 to perform a multi-plane test operation on a dynamically determined block stripe of a memory device (e.g., 130 or 140) of the memory sub-system 110 in accordance with various embodiments described herein. Alternatively, some or all of the multi-plane test operator 113 is included by the local media controller 135, thereby enabling the local media controller 135 to perform a multi-plane test operation on a dynamically determined block stripe of a memory device (e.g., 130) of the memory sub-system 110 in accordance with various embodiments described herein.

Figure 2:
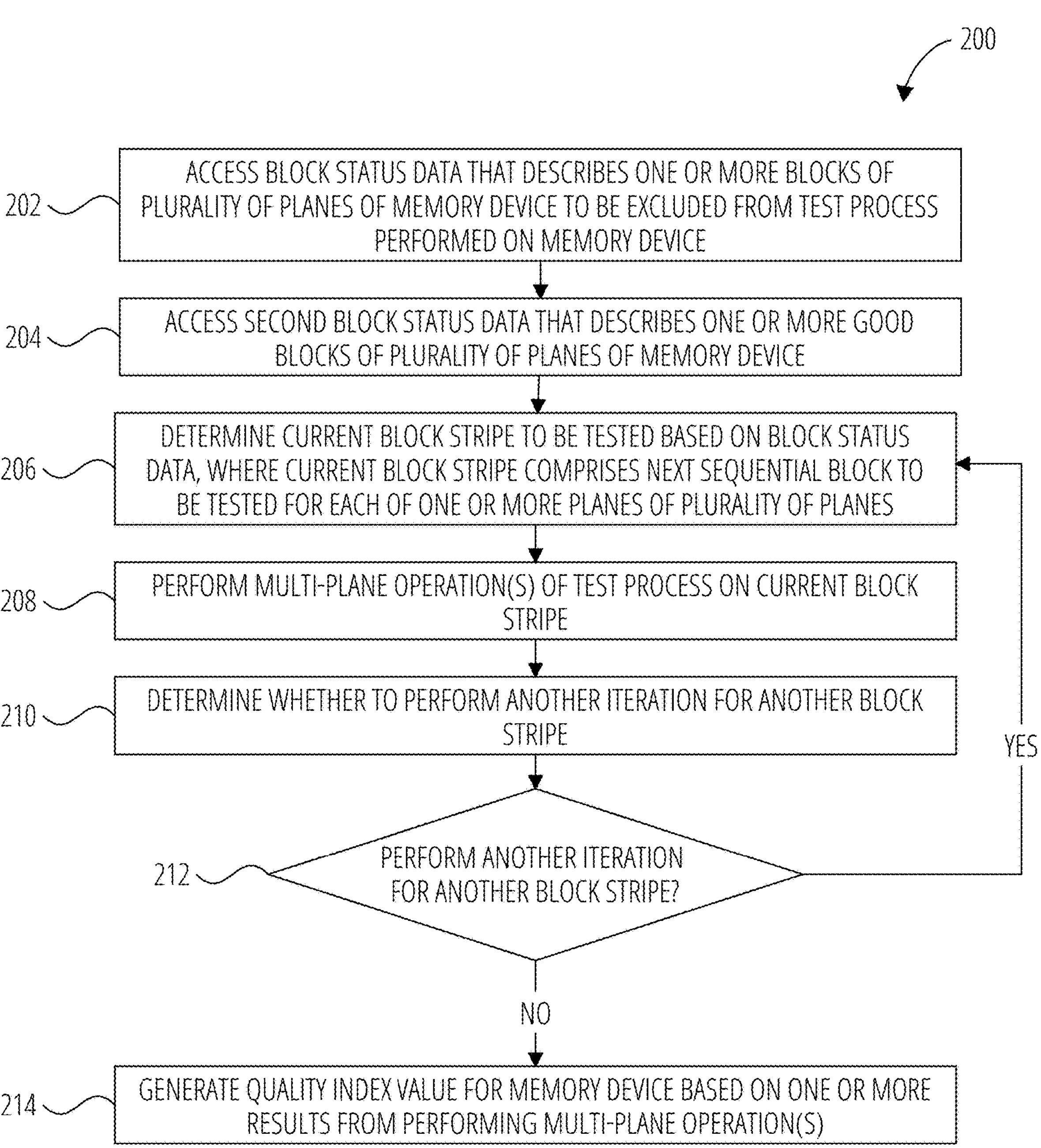
FIG. 2 and FIG. 3 are flow diagrams of example methods for performing a multi-plane test operation on a dynamically determined block stripe of a memory device, in accordance with some embodiments of the present disclosure.
Figure 3:
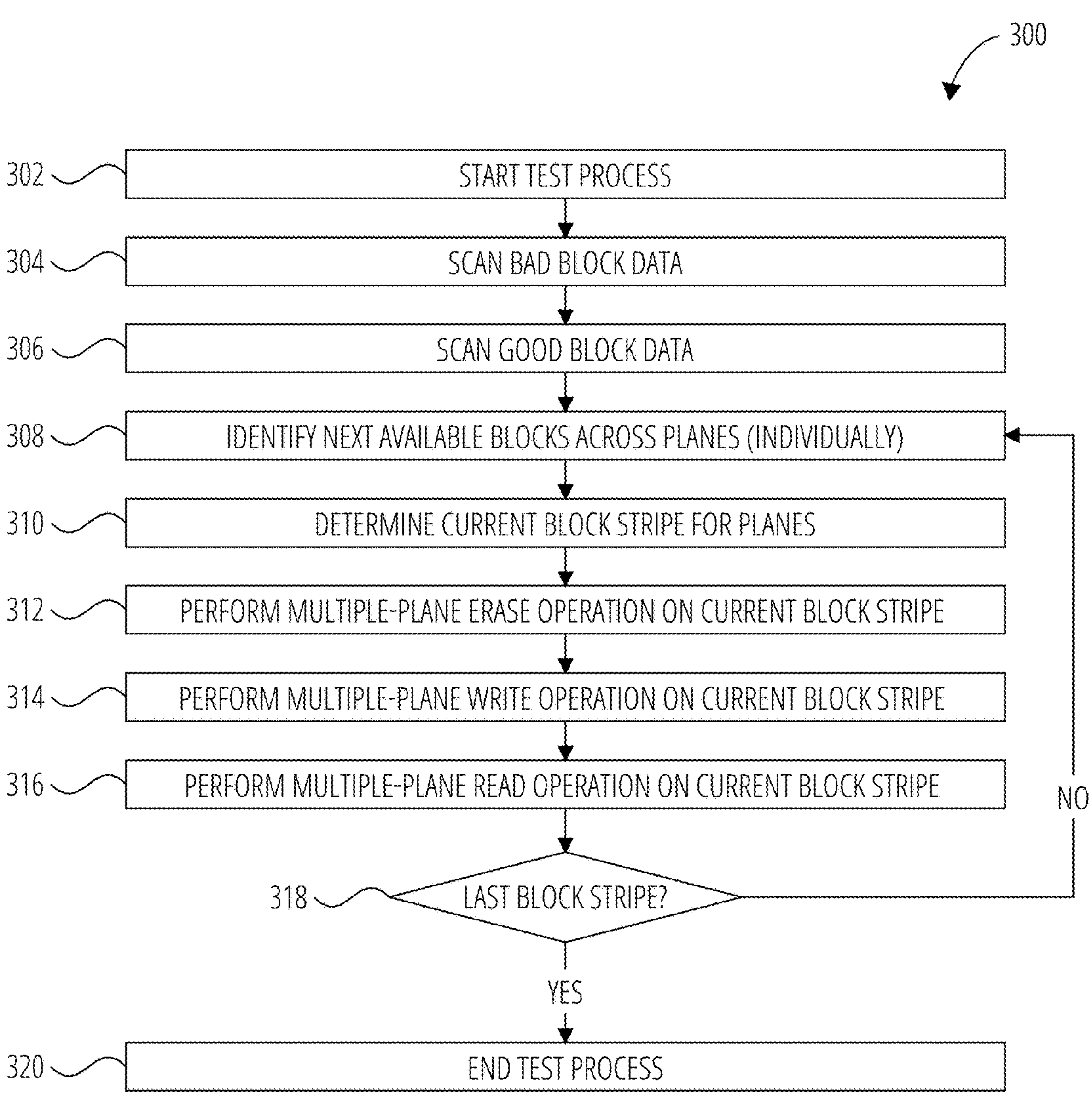

FIG. 2 and FIG. 3 are flow diagrams of example methods 200, 300 for performing a multi-plane test operation on a dynamically determined block stripe of a memory device, in accordance with some embodiments of the present disclosure. Any of methods 200, 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, either of the methods 200, 300 is performed by the memory sub-system controller 115 of FIG. 1 based on the multi-plane test operator 113. Additionally, or alternatively, for some embodiments, either of the methods 200, 300 is performed, at least in part, by the local media controller 135 of the memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. Other process flows are possible.

Referring now to the method 200 of FIG. 2, at operation 202 a processing device (e.g., the processor 117 of the memory sub-system controller 115) accesses first block status data that describes one or more blocks of a plurality of planes of a memory device (e.g., 130, 140) to be excluded from a test process performed on the memory device. For some embodiments, the one or more blocks comprises one or more bad blocks, such as blocks marked as BIBB. After operation 202, the method 200 proceeds to operation 204 and then to operation 206. For some embodiments, operations 206, 208, 210 represent a single iteration of the test process being performed on the memory device.

For operation 204, the processing device accesses second block status data that describes one or more good blocks of the plurality of planes. For some embodiments, the one or more good blocks are identified by an artificial intelligence (e.g., SMAI) prediction algorithm. For instance, the artificial intelligence prediction algorithm comprises a SMAI guaranteed good block prediction algorithm. According to some embodiments, a next sequential block determined for each of the one or more planes of the plurality of planes (during operation 206) is determined (e.g., selected) from the one or more good blocks. Alternatively, for some embodiments, the one or more good blocks are skipped during (e.g., excluded from) selection of a next sequential block for each of the one or more planes of the plurality of planes.

At operation 206, the processing device determines a current block stripe to be tested based on the block status data, where the current block stripe comprises a next sequential block to be tested for each of one or more planes of the plurality of planes. For various embodiments, the (determined) current block stripe comprises individual blocks across multiple planes (e.g., all planes) of a memory die of the memory device. For some embodiments, the next sequential block for each of the one or more planes of the plurality of planes is determined (e.g., selected or chosen) from one or more blocks currently available for data storage. Additionally, for some embodiments, the next sequential block for each of the one or more planes of the plurality of planes is determined (e.g., selected or chosen) from one or more good blocks, such as those described by the second block status data (e.g., SMAI block bit map) accessed by operation 204. Accordingly, operation 204 can determine (e.g., identify or form) the current block stripe to comprise a next sequential good block to be tested for each of the one or more planes of the plurality of planes. Alternatively, for some embodiments, the one or more good blocks described by the second block status data can be skipped during (e.g., excluded from) selection of the next sequential block to be tested for each of one or more planes of the plurality of planes for the current block stripe. By performing operation 206, the processing device can dynamically generate a block stripe that (dynamically) aligns multi-plane operations to improve the performance of the test process (e.g., NFOM test process). For example, operation 206 can enable the test process to perform multi-plane operations based on a distribution of blocks to be excluded from (e.g., skipped by) the test process (e.g., bad blocks, such as BIBB), where the distribution is used to independently choose an individual block (e.g., a next sequential block that is not excluded from the test process) for each plane of the plurality of planes. For example, where a given plane has a bad individual block, the next good block in the plane can be used. Operation 206 can ensure that a given multi-plane operation can be performed on individual blocks of as many planes as possible at a given time (e.g., use all the available planes of the memory device can ensure maximum efficiency). For various embodiments, operation 206 ensures that no given plane of the plurality of planes is idle during a multi-plane operation unless there are no more blocks (e.g., no more good blocks) left to test in the given plane. Additionally, operation 206 can avoid using a same block across all planes, which does not guarantee that a multi-plane operation can be performed across every plane (given that bad blocks or good blocks exist in some planes).

During operation 208, the processing device performs a multi-plane operation of the test process on the current block stripe. The multi-plane operation can comprise a multi-plane erase operation that erases individual blocks of the current block stripe, a multi-plane write operation that writes (e.g., programs) individual blocks of the current block stripe, a multi-plane read operation that reads individual blocks of the current block stripe, or some combination thereof. According to some embodiments, the multi-plane operation comprises performing the multi-plane erase operation on the current block stripe, then performing the multi-plane write operation on the current block stripe, and then performing the multi-plane read operation on the current block stripe. This sequence of multi-plane operations can be performed, for example, as part of a quality-index-generation test process, such as a NFOM test process.

For operation 210, the processing device determines whether to perform the test iteration again for another block stripe. For some embodiments, operation 210 comprises determining whether to perform the test iteration again for another block stripe based on the block status data (e.g., first and second block status data). During operation 210, the processing device can determine whether there are any remaining blocks on any planes of the plurality of planes that can form another block stripe to be tested by the test process (via one or more multi-plane operations). At decision block 212, in response to the processing device determining to perform the test iteration again for another block stripe, method 200 returns to operation 206, otherwise the method 200 proceeds to operation 214.

Eventually, at operation 214, the processing device generates a quality index value for the memory device based on one or more results from performing the multi-plane operation (one or more times via operation 208). For instance, operation 214 can comprise generating a NFOM of the memory device (e.g., where the test process is a NFOM test process). Where operation 208 comprises performing a multi-plane erase operation on the current block stripe (e.g., to erase any data stored in the current block stripe), a multi-plane write operation on the current block stripe (e.g., to write test data to blocks of the current block stripe), and a multi-plane read operation on the current block stripe (e.g., to read back the test data from blocks of the current block stripe), the one or more results used to generate the quality index value (e.g., NFOM) can comprise an aggregation of results from performing the multi-plane operations multiple times.

Referring now to FIG. 3, the method 300 represents an example implementation of the method 200 of FIG. 2. At operation 302, the processing device starts a test process, such as a NFOM test process. Operations 304 through 318 are performed as part of the test process, with operations 308 through 318 representing an iteration of the test process that can be performed multiple times for multiple block stripes (e.g., NFOM chunks). At operation 304, the processing device scans (e.g., accesses) bad block data that describes one or more bad blocks of a memory device. The bad block data can comprise a bad block table, which can describe blocks marked as BIBB. Additionally, at operation 306, the processing device scans (e.g., accesses) good block data that describes one or more blocks of the memory device that have been identified as good blocks. The good block data can comprise good block bit map, such as SMAI block bit map, where good blocks are identified by a SMAI guaranteed good block prediction algorithm.

During operation 308, the processing device identifies (e.g., determines) a next available block (e.g., next sequential good block) for each of one or more planes (e.g., all planes) of the memory device individually and, at operation 310, the processing device determines a current block stripe (e.g., current NFOM chunk) based on the identified next available blocks. Where a given plane does not have a next available block (e.g., next good block), the given plane is not included in the current block stripe and, thus, not operated on by a multi-plane operation (e.g., multi-plane erase, write, and read operations) of the test process.

For operation 312, the processing device performs a multi-plane erase operation on the current block stripe (e.g., current NFOM chunk) to erase any data currently stored in the current block stripe. Then, at operation 314, the processing device performs a multi-plane write (e.g., program) operation on the current block stripe (e.g., current NFOM chunk) to write data (e.g., test data) to blocks of the current block stripe. Thereafter, at operation 316, the processing device performs a multi-plane read operation on the current block stripe to read back data written to blocks of the current block stripe during operation 314.

At decision block 318, in response to the processing device determining that the current block stripe is a last block stripe to be tested, the method 300 proceeds to operation 320, otherwise the method 300 returns to operation 308 to facilitate identification (e.g., determination) of another block stripe to be the current block stripe.

Eventually, at operation 320, the processing device ends the test process. At the end of the test process, the processing device can generate a quality index value, such as a NFOM, based on results generated by operations 312, 314, 316.

FIG. 4 provides a table 402 illustrating an example of performing a multi-plane test operation on a dynamically determined block stripe of a memory device, in accordance with some embodiments of the present disclosure. In particular, the table 402 illustrates performing a multi-plane test operation on a block stripe comprising blocks dynamically and individually determined for each of planes 0 through 5 (e.g., of a memory die) of a memory device. In comparison, FIG. 4 includes a table 400 that illustrates an example of performing a multi-plane test operation by conventional methodology, where the same block is used for each of the planes 0 through 5 (e.g., of a memory die) of a memory device. As shown, each of table 400 and table 402 has bad blocks (e.g., 404), blocks that can be skipped (e.g., 408), and blocks to be tested by a multi-plane test operation (e.g., 406). The bad blocks can be described by bad block data (e.g., bad block table), and the blocks that can be skipped can be described by good block data (e.g., SMAI block bit map).

Referring now to the table 402, a first multi-plane test operation #1 (e.g., a multi-plane erase operation, a multi-plane write operation, or a multi-plane read operation) is performed on a first block stripe comprising: a block 1 of plane 0 (which represents a next sequential block of plane 0, as block 0 of plane 0 is a bad block); a block 1 of plane 1 (which represents a next sequential block of plane 1, as block 0 of plane 1 is a bad block); a block 0 of plane 2; a block 0 of plane 3; a block 1 of plane 4 (which represents a next sequential block of plane 4, as block 0 of plane 4 is a skipped block); and a block 1 of plane 5 (which represents a next sequential block of plane 5, as block 0 of plane 5 is a skipped block). Thereafter, a second multi-plane test operation #2 is performed on a second block stripe comprising block 2 for each of planes 0 through 5, as block 2 is not a bad block or a skipped block for any of the planes. Subsequently, a third multi-plane test operation #3 is performed on a third block stripe comprising: a block 4 of plane 0 (which represents a next sequential block of plane 0, as block 3 of plane 0 is a skipped block); a block 4 of plane 1 (which represents a next sequential block of plane 1, as block 3 of plane 1 is a bad block); a block 3 of plane 2; a block 3 of plane 3; a block 3 of plane 4; and a block 3 of plane 5. Then, a fourth multi-plane test operation #4 is performed on a fourth block stripe comprising: a block 6 of plane 0 (which represents a next sequential block of plane 0, as block 4 was already operated on by operation #3 and block 5 of plane 0 is a bad block); a block 5 of plane 1 (which represents a next sequential block of plane 1, as block 4 was already operated on by operation #3); a block 4 of plane 2; a block 5 of plane 3 (which represents a next sequential block of plane 3, as block 4 of plane 3 is a bad block); a block 5 of plane 4 (which represents a next sequential block of plane 4, as block 4 of plane 4 is a bad block); and a block 4 of plane 5. This continues for performing a fifth multi-plane test operation #5 on a fifth block stripe, and performing a sixth multi-plane test operation #6 on a sixth block stripe.

Figure 5:
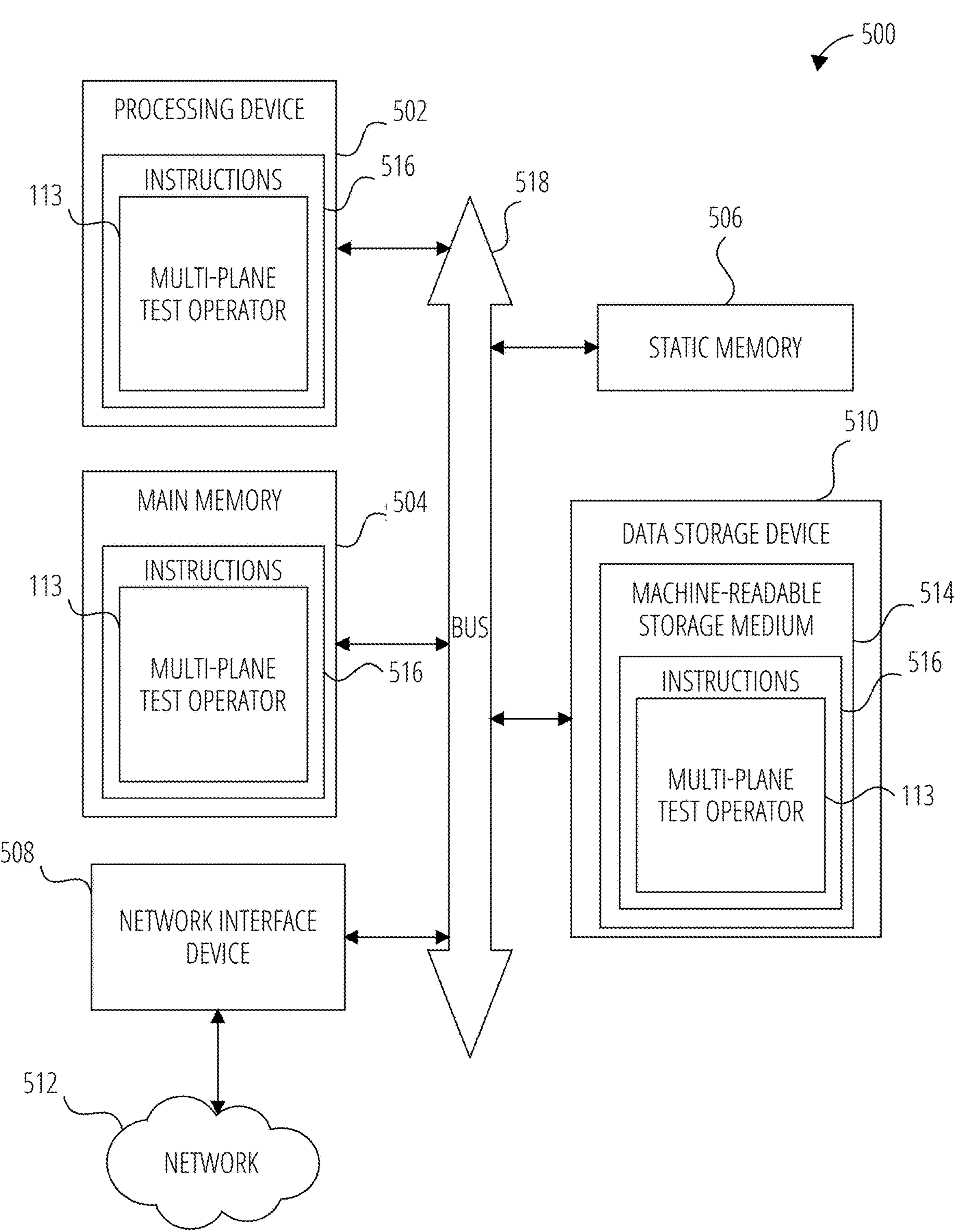
FIG. 5 is a block diagram of an example computer system in which embodiments of the present disclosure may operate.

FIG. 5 illustrates an example machine in the form of a computer system 500 within which a set of instructions can be executed for causing the machine to perform any one or more of the methodologies discussed herein. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations described herein. In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., ROM, flash memory, DRAM such as SDRAM or Rambus DRAM (RDRAM), etc.), a static memory 506 (e.g., flash memory, static random access memory (SRAM), etc.), and a data storage device 510, which communicate with each other via a bus 518.

The processing device 502 represents one or more general-purpose processing devices such as a microprocessor, a central processing unit, or the like. More particularly, the processing device 502 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 502 can also be one or more special-purpose processing devices such as an application-specific integrated circuit (ASIC), a field programmable gate array (FPGA), a digital signal processor (DSP), a network processor, or the like. The processing device 502 is configured to execute instructions 516 for performing the operations and steps discussed herein. The computer system 500 can further include a network interface device 508 to communicate over a network 512.

The data storage device 510 can include a machine-readable storage medium 514 (also known as a computer-readable medium) on which is stored one or more sets of instructions 516 or software embodying any one or more of the methodologies or functions described herein. The instructions 516 can also reside, completely or at least partially, within the main memory 504 and/or within the processing device 502 during execution thereof by the computer system 500, the main memory 504 and the processing device 502 also constituting machine-readable storage media. The machine-readable storage medium 514, data storage device 510, and/or main memory 504 can correspond to the memory sub-system 110 of FIG. 1.

In one embodiment, the instructions 516 include instructions to implement functionality corresponding to performing a multi-plane test operation on a dynamically determined block stripe of a memory device as described herein (e.g., the multi-plane test operator 113 of FIG. 1). While the machine-readable storage medium 514 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Described implementations of the subject matter can include one or more features, alone or in combination as illustrated below by way of examples.

Example 1 is a system comprising: a memory device comprising a plurality of planes of blocks; and a processing device, operatively coupled to the memory device, configured to perform operations comprising: accessing block status data that describes one or more blocks of the plurality of planes to be excluded from a test process performed on the memory device; and performing a test iteration of the test process, the test iteration comprising: determining a current block stripe to be tested based on the block status data, the current block stripe comprising a next sequential block to be tested for each of one or more planes of the plurality of planes; performing a multi-plane operation of the test process on the current block stripe; determining whether to perform the test iteration again for another block stripe; and in response to determining that the test iteration is to be performed again for another block stripe, performing the test iteration again.

In Example 2, the subject matter of Example 1 includes, wherein the performing of the multi-plane operation of the test process on the current block stripe comprises: performing a multi-plane erase operation on the current block stripe.

In Example 3, the subject matter of Example 2 includes, wherein the performing of the multi-plane operation of the test process on the current block stripe comprises: after the multi-plane erase operation, performing a multi-plane write operation on the current block stripe.

In Example 4, the subject matter of Example 3 includes, wherein the performing of the multi-plane operation of the test process on the current block stripe comprises: after the multi-plane write operation, performing a multi-plane read operation on the current block stripe.

In Example 5, the subject matter of Examples 1~4 includes, wherein the operations comprise: generating a quality index value for the memory device based on one or more results from performing the multi-plane operation.

In Example 6, the subject matter of Example 5 includes, wherein the test process comprises a NAND figure of merit (NFOM) test process, and the quality index value is a NFOM of the memory device.

In Example 7, the subject matter of Examples 1-6 includes, wherein the one or more blocks described by the block status data comprises one or more bad blocks of the plurality of planes.

In Example 8, the subject matter of Examples 1-7 includes, wherein the block status data is first block status data, and wherein the operations comprise: accessing second block status data that describes one or more good blocks of the plurality of planes, the next sequential block for each of the one or more planes of the plurality of planes being selected from the one or more good blocks.

In Example 9, the subject matter of Example 8 includes, wherein the one or more good blocks are identified by an artificial intelligence prediction algorithm.

In Example 10, the subject matter of Examples 1-9 includes, wherein the block status data is first block status data, and wherein the operations comprise: accessing second block status data that describes one or more good blocks of the plurality of planes, the one or more good blocks being skipped during selection of the next sequential block for each of the one or more planes of the plurality of planes.

In Example 11, the subject matter of Examples 1-10 includes, wherein the determining of whether to perform the test iteration again for another block stripe comprises: determining whether to perform the test iteration again for another block stripe based on the block status data.

Example 12 is a method to implement any of Examples 1-11.

Example 13 is at least one machine-readable medium comprising instructions that, when executed by a processing device, cause the processing device to perform operations to implement any of Examples 1-11.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMS, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium (such as a non-transitory machine-readable medium) having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and so forth. A machine-readable storage medium can be non-transitory (in other words, not having any transitory signals) in that it does not embody a propagating signal. However, labeling a machine-readable storage medium "non-transitory" should not be construed to mean that the machine-readable storage medium is incapable of movement; the machine-readable storage medium should be considered as being transportable from one physical location to another.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

The invention claimed is:

1. A system comprising:

a memory device comprising a plurality of planes of blocks; and a processing device, operatively coupled to the memory device, configured to perform operations comprising:

accessing block status data that describes one or more blocks of the plurality of planes to be excluded from a test process performed on the memory device; and performing a test iteration of the test process, the test iteration comprising:

dynamically forming a current block stripe to be tested based on the block status data by independently identifying, for each plane of one or more planes of the plurality of planes, a next sequential block available in that plane to be tested, wherein next sequential blocks independently identified for different planes of the current block stripe are permitted to have different block addresses;

performing a multi-plane operation of the test process on the current block stripe;

determining whether to perform the test iteration again for another block stripe; and in response to determining that the test iteration is to be performed again for another block stripe, performing the test iteration again.

2. The system of claim 1, wherein the performing of the multi-plane operation of the test process on the current block stripe comprises:

performing a multi-plane erase operation on the current block stripe.

3. The system of claim 2, wherein the performing of the multi-plane operation of the test process on the current block stripe comprises:

after the multi-plane erase operation, performing a multi-plane write operation on the current block stripe.

4. The system of claim 3, wherein the performing of the multi-plane operation of the test process on the current block stripe comprises:

after the multi-plane write operation, performing a multi-plane read operation on the current block stripe.

5. The system of claim 1, wherein the operations comprise:

generating a quality index value for the memory device based on one or more results from performing the multi-plane operation.

6. The system of claim 5, wherein the test process comprises a NAND figure of merit (NFOM) test process, and the quality index value is a NFOM of the memory device.

7. The system of claim 1, wherein the one or more blocks described by the block status data comprises one or more bad blocks of the plurality of planes.

8. The system of claim 1, wherein the block status data is first block status data, and wherein the operations comprise:

accessing second block status data that describes one or more good blocks of the plurality of planes, the next sequential block available for each of the one or more planes of the plurality of planes being independently identified from the one or more good blocks.

9. The system of claim 8, wherein the one or more good blocks are identified by an artificial intelligence prediction algorithm.

10. The system of claim 1, wherein the block status data is first block status data, and wherein the operations comprise:

accessing second block status data that describes one or more good blocks of the plurality of planes, the one or more good blocks being skipped during independent identification of the next sequential block available for each of the one or more planes of the plurality of planes.

11. The system of claim 1, wherein the determining of whether to perform the test iteration again for another block stripe comprises:

determining whether to perform the test iteration again for another block stripe based on the block status data.

12. At least one non-transitory machine-readable storage medium comprising instructions that, when executed by a processing device, cause the processing device to perform operations comprising:

accessing block status data that describes one or more blocks of a plurality of planes of a memory device to be excluded from a test process performed on the memory device; and performing a test iteration of the test process, the test iteration comprising:

dynamically forming a current block stripe to be tested based on the block status data by independently identifying, for each plane of one or more planes of the plurality of planes, a next sequential block available in that plane to be tested, wherein next sequential blocks independently identified for different planes of the current block stripe are permitted to have different block addresses;

performing a multi-plane operation of the test process on the current block stripe;

determining whether to perform the test iteration again for another block stripe; and in response to determining that the test iteration is to be performed again for another block stripe, performing the test iteration again.

13. The at least one non-transitory machine-readable storage medium of claim 12, wherein the performing of the multi-plane operation of the test process on the current block stripe comprises:

performing a multi-plane erase operation on the current block stripe.

14. The at least one non-transitory machine-readable storage medium of claim 13, wherein the performing of the multi-plane operation of the test process on the current block stripe comprises:

after the multi-plane erase operation, performing a multi-plane write operation on the current block stripe.

15. The at least one non-transitory machine-readable storage medium of claim 14, wherein the performing of the multi-plane operation of the test process on the current block stripe comprises:

after the multi-plane write operation, performing a multi-plane read operation on the current block stripe.

16. The at least one non-transitory machine-readable storage medium of claim 12, wherein the operations comprise:

generating a quality index value for the memory device based on one or more results from performing the multi-plane operation.

17. The at least one non-transitory machine-readable storage medium of claim 16, wherein the test process comprises a NAND figure of merit (NFOM) test process, and the quality index value is a NFOM of the memory device.

18. The at least one non-transitory machine-readable storage medium of claim 12, wherein the one or more blocks described by the block status data comprises one or more bad blocks of the plurality of planes.

19. The at least one non-transitory machine-readable storage medium of claim 12, wherein the block status data is first block status data, and wherein the operations comprise:

accessing second block status data that describes one or more good blocks of the plurality of planes, the next sequential block available for each of the one or more planes of the plurality of planes being independently identified from the one or more good blocks.

20. A method comprising:

accessing, by a processing device, block status data that describes one or more blocks of a plurality of planes of a memory device to be excluded from a test process performed on the memory device; and performing, by the processing device, a test iteration of the test process, the test iteration comprising:

dynamically forming a current block stripe to be tested based on the block status data by independently identifying, for each plane of one or more planes of the plurality of planes, a next sequential block available in that plane to be tested, wherein next sequential blocks independently identified for different planes of the current block stripe are permitted to have different block addresses;

performing a multi-plane operation of the test process on the current block stripe;

determining whether to perform the test iteration again for another block stripe; and in response to determining that the test iteration is to be performed again for another block stripe, performing the test iteration again.

* * * * *